US010396140B2

(12) United States Patent
Kim et al.

(10) Patent No.: US 10,396,140 B2
(45) Date of Patent: Aug. 27, 2019

(54) THIN FILM TRANSISTOR INCLUDING A VERTICAL CHANNEL AND DISPLAY APPARATUS USING THE SAME

(71) Applicant: SAMSUNG DISPLAY CO., LTD., Yongin-si, Gyeonggi-do (KR)

(72) Inventors: Jeehoon Kim, Yongin-si (KR); Shinhyuk Yang, Yongin-si (KR); Doohyun Kim, Yongin-si (KR); Kwangsoo Lee, Yongin-si (KR); Inyoung Jung, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/427,111

(22) Filed: Feb. 8, 2017

(65) Prior Publication Data

US 2017/0330924 A1 Nov. 16, 2017

(30) Foreign Application Priority Data

May 12, 2016 (KR) ........................ 10-2016-0058192

(51) Int. Cl.
*H01L 27/32* (2006.01)
*H01L 29/786* (2006.01)
(Continued)

(52) U.S. Cl.
CPC ...... *H01L 27/3262* (2013.01); *H01L 27/3246* (2013.01); *H01L 27/3272* (2013.01);
(Continued)

(58) Field of Classification Search
None
See application file for complete search history.

(56) References Cited

U.S. PATENT DOCUMENTS

2006/0175609 A1* 8/2006 Chan ................. H01L 29/66787 257/59
2013/0161732 A1* 6/2013 Hwang ............... H01L 29/7827 257/329
(Continued)

FOREIGN PATENT DOCUMENTS

KR 10-2007-0053029 5/2007
KR 10-2010-0005303 1/2010
KR 10-2013-0074954 7/2013

*Primary Examiner* — Khaja Ahmad
(74) *Attorney, Agent, or Firm* — F. Chau & Associates, LLC

(57) ABSTRACT

A thin film transistor includes a substrate and a gate electrode disposed over the substrate. The gate electrode includes a center part and a peripheral part configured to at least partially surround the center part. The thin film transistor further includes a gate insulating layer disposed below the gate electrode and a first electrode insulated from the gate electrode by the gate insulating layer. The first electrode has at least a portion thereof overlapping the center part. The thin film transistor additionally includes a spacer disposed below the first electrode and a second electrode insulated from the first electrode by the spacer. The second electrode has at least a portion thereof overlapping the peripheral part. The thin film transistor further includes a semiconductor layer connected to the first and second electrodes, and insulated from the gate electrode by the gate insulating layer.

25 Claims, 17 Drawing Sheets

(51) Int. Cl.

| | |
|---|---|
| ***H01L 51/52*** | (2006.01) |
| ***H01L 29/417*** | (2006.01) |
| ***H01L 29/423*** | (2006.01) |
| ***H01L 29/66*** | (2006.01) |

(52) U.S. Cl.

CPC .. *H01L 29/41733* (2013.01); *H01L 29/42384* (2013.01); *H01L 29/66742* (2013.01); *H01L 29/7869* (2013.01); *H01L 29/78642* (2013.01); *H01L 51/5203* (2013.01); *H01L 27/3248* (2013.01); *H01L 27/3265* (2013.01)

(56) References Cited

U.S. PATENT DOCUMENTS

| | | | | |
|---|---|---|---|---|
| 2013/0207117 | A1* | 8/2013 | An | H01L 27/3276 257/71 |
| 2014/0103307 | A1 | 4/2014 | Chang et al. | |
| 2015/0194491 | A1 | 7/2015 | Schmidt et al. | |
| 2015/0194506 | A1 | 7/2015 | Chou et al. | |
| 2015/0221767 | A1 | 8/2015 | Anderson et al. | |
| 2015/0235897 | A1 | 8/2015 | Fu et al. | |
| 2015/0249143 | A1 | 9/2015 | Sand et al. | |
| 2015/0255623 | A1* | 9/2015 | Nelson | H01L 29/78642 257/66 |
| 2016/0133754 | A1* | 5/2016 | Moon | H01L 29/78645 349/43 |
| 2016/0300899 | A1* | 10/2016 | Zhang | H01L 27/12 |

* cited by examiner

THIN FILM TRANSISTOR INCLUDING A VERTICAL CHANNEL AND DISPLAY APPARATUS USING THE SAME

CROSS-REFERENCE TO RELATED APPLICATION

This application claims priority under 35 U.S.C. § 119 to Korean Patent Application No. 10-2016-0058192 filed on May 12, 2016 in the Korean Intellectual Property Office, the disclosure of which is incorporated by reference herein in its entirety.

TECHNICAL FIELD

Exemplary embodiments of the present inventive concept relate to a thin film transistor and a display apparatus using the thin film transistor, and more particularly, to a thin film transistor including a vertical channel and a display apparatus using the thin film transistor.

DISCUSSION OF THE RELATED ART

A display apparatus is an apparatus that is used to visually display images. Types of display apparatuses may include a liquid crystal display, an electrophoretic display, an organic light-emitting display, an inorganic light-emitting display, a field emission display, a surface-conduction electron-emitter display, a plasma display, a cathode ray display, etc.

The display apparatus may include a display device, a thin film transistor, wiring to connect those components to one another, etc. Thin film transistors having a high integrity and high performance have been used to achieve a higher resolution image displayed by the display apparatus.

SUMMARY

According to an exemplary embodiment of the present inventive concept, a thin film transistor includes a substrate and a gate electrode disposed over the substrate. The gate electrode includes a center part and a peripheral part configured to at least partially surround the center part. The thin film transistor further includes a gate insulating layer disposed below the gate electrode and a first electrode insulated from the gate electrode by the gate insulating layer. The first electrode has at least a portion thereof overlapping the center part. The thin film transistor additionally includes a spacer disposed below the first electrode and a second electrode insulated from the first electrode by the spacer. The second electrode has at least a portion thereof overlapping the peripheral part. The thin film transistor further includes a semiconductor layer connected to the first and second electrodes, and insulated from the gate electrode by the gate insulating layer.

In an exemplary embodiment of the present inventive concept, the peripheral part is connected to one side of the center part, is uniformly separated from the center part according to a shape of the center part, and is configured to at least partially surround the perimeter of the center part.

In an exemplary embodiment of the present inventive concept, the center part has a circular shape, an elliptical shape, or a polygonal shape.

In an exemplary embodiment of the present inventive concept, the peripheral part is configured to surround the perimeter of the center part.

In an exemplary embodiment of the present inventive concept, the center part and the first electrode, and the gate insulating layer, which is disposed between the center part and the first electrode, form a capacitor.

In an exemplary embodiment of the present inventive concept, the semiconductor layer is configured to cover a portion of the first electrode and at least a portion of the second electrode, and to connect the first electrode and the second electrode to one another in a direction perpendicular to an upper surface of the substrate.

In an exemplary embodiment of the present inventive concept, the first electrode overlaps at least a portion of the second electrode.

In an exemplary embodiment of the present inventive concept, the spacer includes a hole.

In an exemplary embodiment of the present inventive concept, the first electrode includes a hole.

In an exemplary embodiment of the present inventive concept, the gate electrode and the gate insulating layer have a same planar shape.

In an exemplary embodiment of the present inventive concept, the thin film transistor further includes a protection layer configured to cover the gate electrode. The protection layer is a wholly connected body spanning the entire surface of the substrate.

In an exemplary embodiment of the present inventive concept, the semiconductor layer includes an oxide semiconductor.

According to an exemplary embodiment of the present inventive concept, a display apparatus includes a thin film transistor. The thin film transistor includes a substrate and a gate electrode including a center part and a peripheral part configured to at least partially surround the center part. The thin film transistor further includes a gate insulating layer disposed below the gate electrode. The thin film transistor additionally includes a first electrode which is insulated from the gate electrode by the gate insulating layer, and has at least a portion thereof overlapping the center part. The thin film transistor further includes a spacer disposed below the first electrode. The thin film transistor additionally includes a second electrode which is insulated from the first electrode by the spacer, and has at least a portion thereof overlapping the peripheral part. The thin film transistor additionally includes a semiconductor layer which is connected to the first electrode and the second electrode, and is insulated from the gate electrode by the gate insulating layer. In addition to the thin film transistor, the display apparatus further includes a planarization layer configured to cover the thin film transistor, and a pixel electrode which is disposed over the planarization layer and is electrically connected to the first electrode or the second electrode. The display apparatus additionally includes a counter electrode disposed over the pixel electrode. The display apparatus further includes an intermediate layer disposed between the pixel electrode and the counter electrode.

In an exemplary embodiment of the present inventive concept, the display apparatus further includes a first capacitor including a third electrode including a same material as the first electrode. The display apparatus additionally includes a fourth electrode including a same material as the second electrode, and a first insulating layer disposed between the third electrode and the fourth electrode, and including a same material as the spacer.

In an exemplary embodiment of the present inventive concept, the display apparatus further includes a second capacitor including a fifth electrode including a same material as the first electrode, a sixth electrode including a same material as the gate electrode, and a second insulating layer disposed between the fifth electrode and the sixth electrode, and including a same material as the gate insulating layer.

In an exemplary embodiment of the present inventive concept, the display apparatus further includes a pixel defining layer configured to expose a center area of the pixel electrode, and to cover a peripheral area thereof.

In an exemplary embodiment of the present inventive concept, the intermediate layer includes an organic light-emitting layer.

In an exemplary embodiment of the present inventive concept, the peripheral part is connected to one side of the center part, is uniformly separated from the center part according to a shape of the center part, and is configured to at least partially surround the periphery of the center part.

In an exemplary embodiment of the present inventive concept, the center part, a source electrode, and a gate insulating layer, which is disposed between the center part and the source electrode, form a capacitor.

In an exemplary embodiment of the present inventive concept, the semiconductor layer is configured to cover a portion of the source electrode and at least a portion of the drain electrode, and to connect the source electrode and the drain electrode in a direction perpendicular to an upper surface of the substrate.

According to an exemplary embodiment of the present inventive concept, a thin film transistor includes a substrate, a bottom electrode disposed on the substrate, an upper electrode disposed above and partially overlapping the bottom electrode, and a spacer disposed between the bottom electrode and the upper electrode. The thin film transistor further includes a semiconductor layer covering portions of the bottom electrode and portions of the upper electrode, and extending vertically to connect the bottom electrode and the upper electrode. The thin film transistor additionally includes a gate electrode disposed over the upper electrode. The gate electrode is insulated from the upper electrode and the semiconductor layer by a gate insulating layer.

In an exemplary embodiment of the present inventive concept, the gate electrode, the upper electrode, and the gate insulating layer form a capacitor.

In an exemplary embodiment of the present inventive concept, adjusting a thickness of the spacer, vertically adjusts a length of the semiconductor layer.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION

Exemplary embodiments of the present inventive concept will be described more fully hereinafter with reference to the accompanying drawings.

Figure 1:
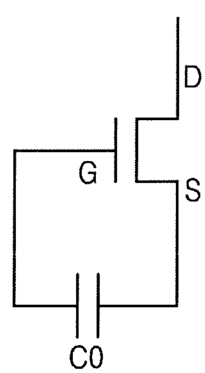
FIG. 1 is a circuit diagram of a thin film transistor according to an exemplary embodiment of the present inventive concept.

FIG. 1 is a circuit diagram of a thin film transistor (TFT) according to an exemplary embodiment of the present inventive concept.

Referring to FIG. 1, the TFT according to an exemplary embodiment of the present inventive concept may include a gate electrode G, a source electrode S, and a drain electrode D, and an overlap capacitor C0 that may be disposed between the source electrode S and the gate electrode G. The overlap capacitor C0 may function as a storage capacitor to store a voltage between the source electrode S and the gate electrode G. The TFT may control current flowing through the drain electrode D, corresponding to a voltage stored in the overlap capacitor C0.

The overlap capacitor C0 is illustrated as being disposed between the source electrode S and the gate electrode G in FIG. 1. However, exemplary embodiments of the present inventive concept are not limited thereto. For example, the overlap capacitor C0 may be disposed between the drain electrode D and the gate electrode G.

Figure 2A:
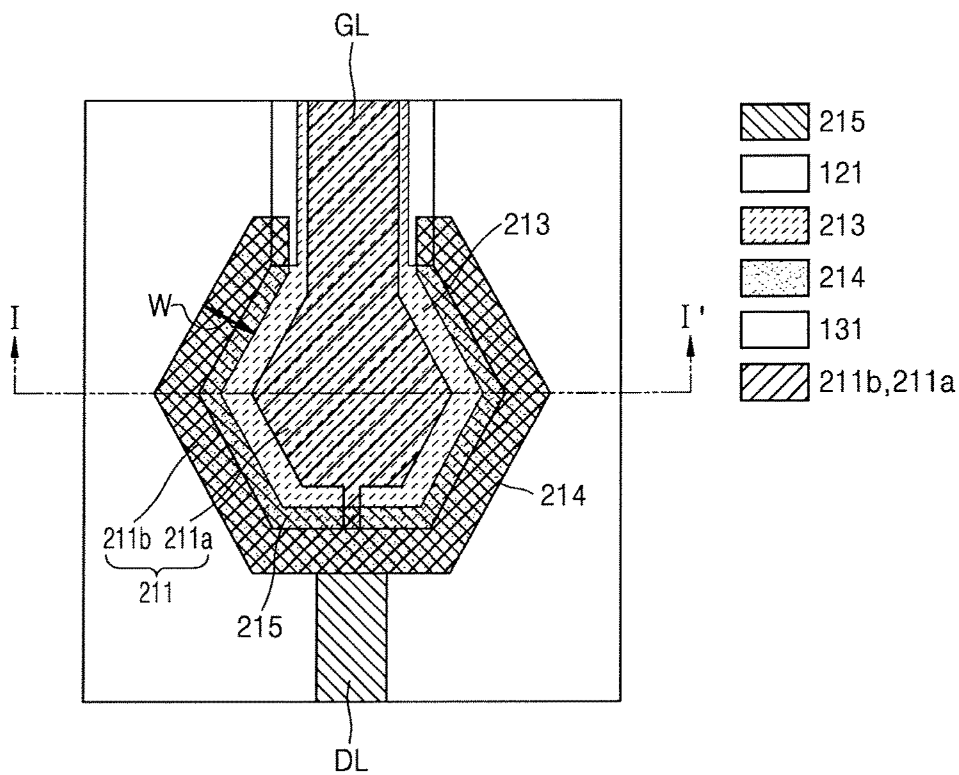
FIG. 2A is a planar view of a thin film transistor according to an exemplary embodiment of the present inventive concept.
Figure 2B:
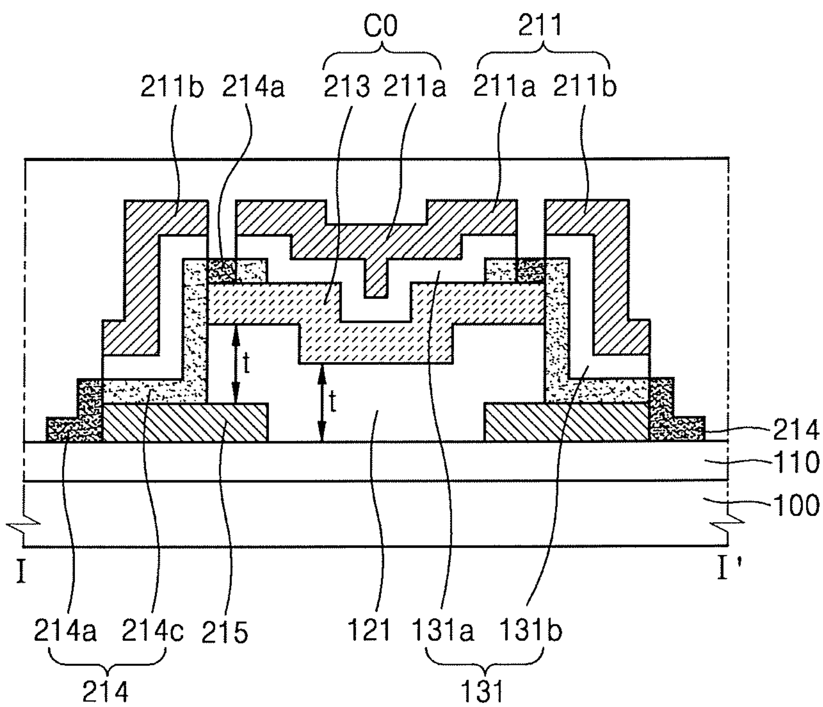
FIG. 2B is a cross-sectional view of the thin film transistor of FIG. 2A, taken along line I-I'.

FIG. 2A is a planar view of a TFT according to an exemplary embodiment of the present inventive concept. FIG. 2B is a cross-sectional view of the TFT of FIG. 2A, along line I-I'.

Referring to FIGS. 2A and 2B, the TFT according to an exemplary embodiment of the present inventive concept may include a gate electrode 211 including a center part 211*a* and a peripheral part 211*b*. The TFT may further include a first electrode 213 having at least a portion thereof overlapping the center part 211*a* of the gate electrode 211. For example, the first electrode 213 may be disposed below the center part 211*a* of the gate electrode 211. The TFT may additionally include a second electrode 215 having at least a portion thereof overlapping the peripheral part 211*b* of the gate electrode 211. For example, the second gate electrode 215 may be disposed below the peripheral part 211*b* of the gate electrode 211. The TFT may further include a semiconductor layer 214 forming a channel in a direction perpendicular to an upper surface of a substrate 100 and a horizontal direction extending along the upper surface of the substrate 100. In addition, the TFT may include a gate insulating layer 131 and a spacer 121. The TFT may be arranged over the substrate 100, and a buffer layer 110 may be disposed between the substrate 100 and the TFT.

The substrate 100 may include various materials such as glass, metal, and/or plastic. According to an exemplary embodiment of the present inventive concept, the substrate 100 may include flexible materials. Accordingly, the substrate 100 may be flexible and may be easily bent, warped, or wrapped without damaging the substrate 100. The substrate 100 may include various materials having flexible or bendable characteristics. For example, the substrate 100 may include polymer resins such as polyethersulphone (PES), polyacrylate (PAR), polyethereimide (PEI), polyethylene naphthalate (PEN), polyethylene terephthalate (PET), polyphenylene sulfide (PPS), polyallylate, polyimide (PI), polycarbonate (PC), and/or cellulose acetate propionate (CAP).

The buffer layer 110 may be disposed over the substrate 100, to reduce or prevent an infiltration of foreign objects, moisture, outside air, or other external contaminants through a bottom surface of the substrate 100. Further, the buffer layer 110 may provide a planarization surface on the substrate 100. For example, the buffer layer 110 may flatten a surface of the substrate 100. The buffer layer 110 may include inorganic materials such as oxides and nitrides, or organic materials, or mixtures of organic and inorganic materials, and may have a single layer or multilayer structure including inorganic materials and/or organic materials. The buffer layer 110 may alternatively be omitted.

The gate electrode 211 may include the center part 211*a* and the peripheral part 211*b* that partially surrounds the center part 211*a*. A gate line GL that applies a gate voltage to the gate electrode 211 may be connected to the center part 211*a*, and the peripheral part 211*b* may surround the center part 211*a* except for an area through which the gate line GL passes. For example, the peripheral part 211*b* may have an opening to allow the gate line GL to pass through.

A portion of the center part 211*a* and the first electrode 213 may overlap one another, with the gate insulating layer 131 interposed therebetween, and may form the overlap capacitor C0. For example, the overlap capacitor C0 may include the center part 211*a* and the first electrode 213 may be electrodes, and a central insulating part 131*a* of the gate insulating layer 131, which is disposed between the center part 211*a* and the first electrode 213, may overlap a conductive layer of the overlap capacitor C0. The center part 211*a* is illustrated as having a hexagonal shape in FIG. 2A. However, exemplary embodiments of the present inventive concept are not limited thereto. For example, the center part 211*a* may have a circular shape, an elliptical shape, a polygonal shape, or an atypical shape. The shape of the center part 211*a* may be determined by considering a capacitance of the overlap capacitor C0 and devices arranged around the TFT.

According to the planar view of FIG. 2A, the peripheral part 211*b* may be connected to one side of the center part 211*a*, and may partially surround the perimeter of the center part 211*a* while being uniformly separate from the center part 211*a* according to the shape of the center part 211*a*. In addition, the peripheral part 211*b* may surround the perimeter of the center part 211*a* with a certain width W. Accordingly, an overall shape of the gate electrode 211 may be defined by the shape of the center part 211*a*. According to FIG. 2A, the shape formed by the surroundings of the gate electrode 211 (e.g., the center part 211*a*) may be hexagonal according to the shape of the center part 211*a*. The shape formed by the surroundings of the gate electrode 211 may variously change according to the shape of the center part 211*a*. For example, the shape formed by the surroundings of the gate electrode 211 may be circular, elliptical, polygonal or atypical. However, the peripheral part 211*b* may have a shape that is different from a shape of the center part 211*a*.

The peripheral part 211*b* and at least a portion of the semiconductor layer 214 may overlap one another, with the gate insulating layer 131 therebetween. In addition, the semiconductor layer 214 may be disposed below the peripheral area 211*b*. In addition, the peripheral part 211*b* and at least a portion of the second electrode 215 may overlap one another, with the gate insulating layer 131 and the semiconductor layer 214 interposed therebetween. In addition, the second electrode 215 may be disposed below the peripheral area 211*b*.

The gate electrode 211 may include metals such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu). Further, the gate electrode 211 may include a single layer or a multilayer structure.

At least a portion of the first electrode 213 and the center part 211*a* of the gate electrode 211 may overlap one another. Further, the first electrode 213 may be disposed below the center part 211*a*. In addition, the first electrode 213 may be connected to one end of the semiconductor layer 214 and function as a source electrode or a drain electrode. For example, the first electrode 213 may be connected to an upper portion of the semiconductor layer 214. As described above, the first electrode 213 may function as one electrode of the overlap capacitor C0. According to the planar view, the first electrode 213 may have the same shape as the center part 211*a* of the gate electrode 211, and a total area of the first electrode 213 may be larger than a total area of the center part 211*a*.

At least a portion of the second electrode 215 and the peripheral part 211*b* of the gate electrode 211 may overlap one another. Further, the second electrode 215 may be disposed below the peripheral part 211*b* of the gate electrode 211. In addition, the second electrode 215 may be connected to one end of the semiconductor layer 214 and function as a source electrode or a drain electrode. For example, the second electrode 215 may be connected to a bottom portion of the semiconductor layer 214. In addition, if the first electrode 213 functions as a source electrode, the second electrode 215 may function as a drain electrode, and if the first electrode 213 functions as a drain electrode, the second electrode 215 may function as a source electrode. Further, the spacer 121 may be an insulator between the first electrode 213 and the second electrode 215.

A peripheral area of the first electrode 213 and a portion of the second electrode 215 may overlap one another, with the spacer 121 interposed therebetween. However, exemplary embodiments of the present inventive concept are not limited thereto. The first electrode 213 and the second electrode 215 might not overlap one another.

The first electrode 213 and/or the second electrode 215 may include conductive materials including, for example, Mo, Al, Cu, Ti, etc. In addition, the first electrode 213 and/or the second electrode 215 may have a single layer or a multilayer structure including such conductive materials. For example, the first electrode 213 and/or the second electrode 215 may have a multilayer structure including Ti/Al/Ti.

The semiconductor layer 214 may include a channel area 214*c* and a source-drain area 214*a* arranged at both ends of the channel area 214*c*. The source-drain area 214*a* may be an area where the first electrode 213 and the second electrode 215 are connected to one another through the semiconductor layer 214.

The semiconductor layer 214 may be connected to the first electrode 213 and the second electrode 215, and the semiconductor layer 214 may have at least a portion thereof overlapping the gate electrode 211. For example, the portion of the semiconductor layer 214 may be disposed below the gate electrode 211. The gate insulating layer may be an insulator between the semiconductor layer 214 and the gate electrode 211. Further, the semiconductor layer 214 may overlap the peripheral part 211*b* of the gate electrode 211, and a portion of the semiconductor layer 214 may overlap the center part 211*a* of the gate electrode 211. In exemplary embodiments of the present inventive concept, the semiconductor layer 214 may be a divided structure.

The semiconductor layer 214 may include an oxide semiconductor. For example, the semiconductor layer 214 may include metal elements of Groups 12, 13, and 14 of the periodic table of elements, such as zinc (Zn), indium (In), gallium (Ga), tin (Sn), cadmium (Cd), germanium (Ge), and hafnium (Hf), and metal oxides selected from a combination of these metals. According to an exemplary embodiment of the present inventive concept, the semiconductor layer 214 may include oxides of Zn such as Zn oxide, In—Zn oxide, and Ga—In—Zn oxide. For example, the semiconductor layer 214 may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), etc. However, materials of the semiconductor layer 214 are not limited thereto. For example, the semiconductor layer 214 may include various materials such as amorphous silicon, polycrystalline silicon, or an organic semiconductor material.

The source-drain area 214*a* may be an area where the semiconductor layer 214 is connected to the first electrode 213 and the second electrode 215, and an area where an oxide semiconductor material becomes conductive by increasing carrier density. For example, the carrier density may be modified by a plasma treatment on the source-drain area 214*a* of the semiconductor layer 214. The plasma treatment may be performed by using hydrogen ($H_2$) series gas, fluoride series gas, nitrogen ($N_2$) gas, or a combination of these gasses.

When performing plasma treatment with hydrogen ($H_2$) gas, the hydrogen gas may penetrate the oxide semiconductor in the thickness direction (e.g., a horizontal direction), increase the carrier density, and reduce surface resistance. In addition, the plasma treatment by using the hydrogen gas may remove oxygen on a surface of the oxide semiconductor, and thus, reduce the surface resistance via de-oxidation of oxide metals.

In the case of the plasma treatment by using fluoride series gas, the fluoride series gas constituent may increase, and the oxygen constituent may relatively decrease on the surface of the oxide semiconductor, and thus, additional carriers may be formed on the surface of the oxide semiconductor. Accordingly, the carrier density may increase and the surface resistance may decrease. The fluoride series gasses may include $CF_4$, $C_4F_8$, $NF_3$, $SF_6$, or a combination of these gasses. However, exemplary embodiments of the present inventive concept are not limited thereto.

In the case of the plasma treatment by using nitrogen gas ($N_2$), an annealing process may be simultaneously performed. According to an exemplary embodiment of the present inventive concept, the annealing process may be performed at about 300° C. to about 400° C. for about 1 hour to about 2 hours.

The semiconductor layer 214 may cover edges of the first electrode 213 and at least a portion of the second electrode 215, and the semiconductor layer 214 may connect the first electrode 213 and the second electrode 215 to one another in a direction perpendicular to the upper surface of the substrate 100. Accordingly, a channel may be vertically formed in the channel area 214*c* of the semiconductor layer 214.

The spacer 121 may be disposed on a bottom surface of the first electrode 213, and the spacer 121 may be an insulator disposed between the first electrode 213 and the second electrode 215. In addition, the spacer 121 may adjust a length of a vertical channel of the semiconductor layer 214 by a thickness t of the spacer 121. The spacer 121 may be disposed between the first electrode 213 and the second electrode 215. In addition, the spacer 121 may cover a portion of the second electrode 215.

The spacer 121 may include either organic or inorganic insulating materials. According to an exemplary embodiment of the present inventive concept, the spacer 121 may include silicon oxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium oxide ($HfO_2$), zinc peroxide ($ZnO_2$), or other aluminum oxides. The spacer 121 may be formed by various deposition methods such as sputtering, chemical vapor deposition (CVD) and plasma-enhanced chemical vapor deposition (PECVD). The spacer 121 and the first electrode 213 may be simultaneously patterned and formed. However, exemplary embodiments of the present inventive concept are not limited thereto. For example, the spacer 121 and the first electrode 213 may each be patterned and formed at different times from one another.

The gate insulating layer 131 may be arranged on a bottom surface of the gate electrode 211. In addition, the gate insulating layer 131 may insulate the gate electrode 211 and the first electrode 213, and the gate electrode 211 and the semiconductor layer 214.

The gate insulating layer 131 may be the same shape as the gate electrode 211. For example, the gate insulating layer 131 may have a hexagonal shape. The gate insulating layer 131 may include the central insulating part 131*a* and a peripheral insulating part 131*b*. The central insulating part 131*a* may have the same shape as the center part 211*a* of the gate electrode 211, and the peripheral insulating part 131*b* may have the same shape as the peripheral part 211*b* of the gate electrode 211. The central insulating part 131*a* may overlap the conductive layer of the overlap capacitor C0. Further, the gate insulating layer 131 and the gate electrode 211 may be simultaneously patterned and formed. However, exemplary embodiments of the present inventive concept are not limited thereto. For example, the gate insulating layer 131 and the gate electrode 211 may each be patterned and formed at different times from one another.

The gate insulating layer 131 may include either organic or inorganic insulating materials. According to an exemplary embodiment of the present inventive concept, the gate insulating layer 131 may include, for example, $SiO_2$, $SiN_x$, SiON, $Al_2O_3$, $TiO_2$, $Ta_2O_5$, $HfO_2$, or $ZnO_2$. The gate insulating layer 131 may be formed by various deposition methods such as sputtering, CV, and PECVD.

As described above, the TFT according to an exemplary embodiment of the present inventive concept may simultaneously form the vertical channel and the overlap capacitor C0 via the center part 211*a* of the gate electrode 211 and the first electrode 213.

Since the TFT uses the vertical channel, a size of the TFT may be reduced regardless of a channel length. For example, a width of the TFT may be reduced without changing the channel length. In addition, since the channel length of the vertical channel is adjustable by the thickness t of the spacer 121, the channel length may be adjusted without changing the width of the TFT.

Since the TFT includes the overlap capacitor C0, the TFT may provide high-density integration of an apparatus which requires a capacitor.

FIGS. 3A through 3F are planar views illustrating processes of manufacturing TFTs, according to exemplary embodiments of the present inventive concept.

Figure 3A:
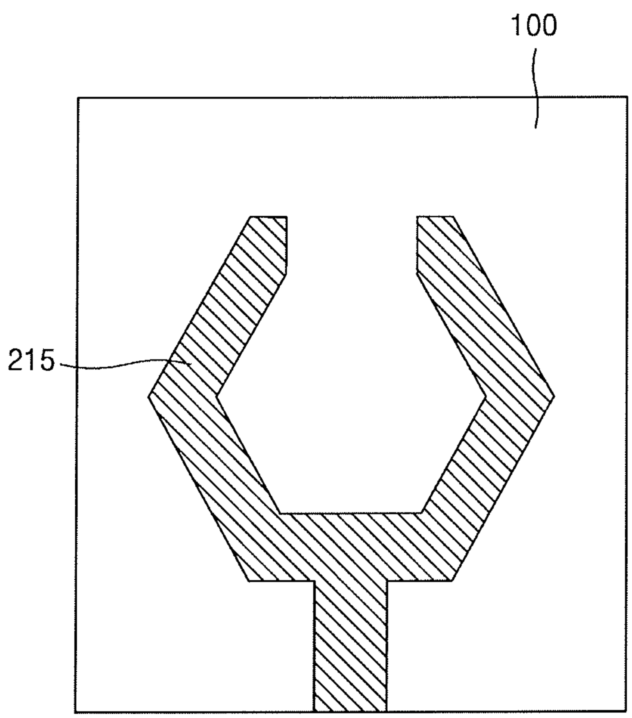
FIG. 3A is a planar view illustrating a process of manufacturing a thin film transistor, according to an exemplary embodiment of the present inventive concept.

Referring to FIG. 3A, the second electrode 215 may be formed on the substrate 100. The second electrode 215 may include Mo, Al, Cu and/or Ti, etc. In addition, the second electrode 215 may be a single layer or a multi-layer structure. The second electrode 215 may be formed by various deposition methods, such as sputtering, CVD, and PECVD, and may be patterned thereafter. The buffer layer 110 may be disposed between the substrate 100 and the second electrode 215.

Figure 3B:
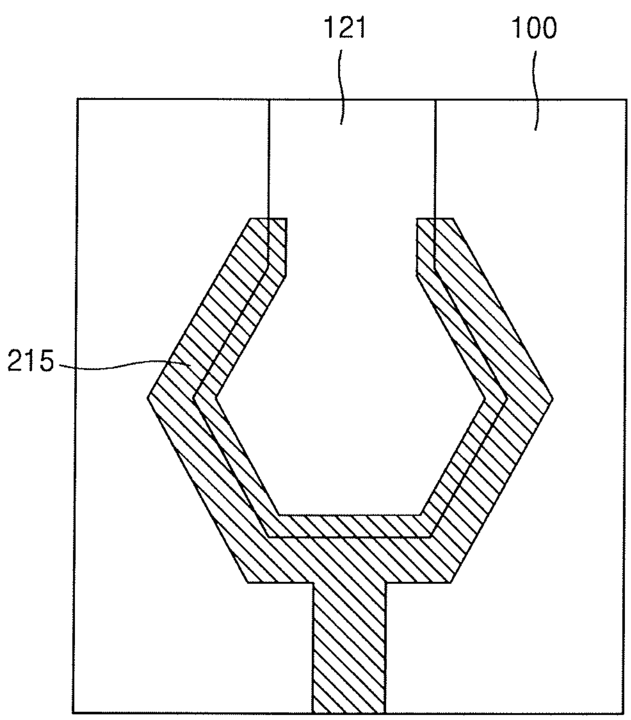
FIG. 3B is a planar view illustrating a process of manufacturing a thin film transistor, according to an exemplary embodiment of the present inventive concept.

The spacer 121 may be formed as illustrated in FIG. 3B. The spacer 121 may include either organic or inorganic insulating materials. According to an exemplary embodiment of the present inventive concept, the spacer 121 may include $SiO_2$, $SiN_x$, SiON, $Al_2O_3$, $TiO_2$, $Ta_2O_5$, $HfO_2$, $ZnO_2$, or aluminum oxide, etc. The spacer 121 may be formed by various deposition methods, such as sputtering, CVD, and PECVD, and the spacer 121 may be patterned thereafter.

Figure 3C:
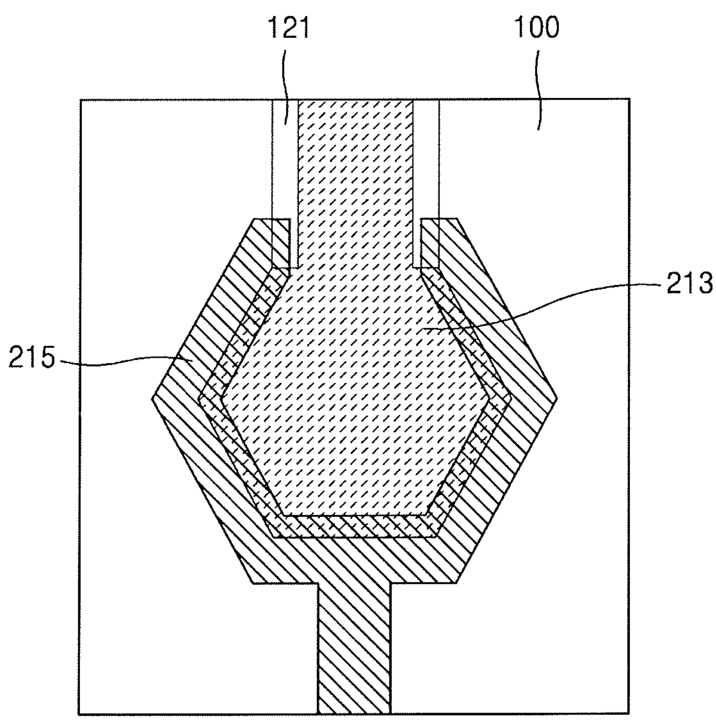
FIG. 3C is a planar view illustrating a process of manufacturing a thin film transistor, according to an exemplary embodiment of the present inventive concept.

The first electrode 213 may be formed on the spacer 121 as illustrated in FIG. 3C. The first electrode 213 may include Mo, Al, Cu and/or Ti, etc. In addition, the first electrode 213 may be a single layer or a multi-layer structure. The second electrode 215 may be formed by various deposition methods, such as sputtering, CVD, and PECVD, and the second electrode 215 may be patterned thereafter.

Figure 3D:
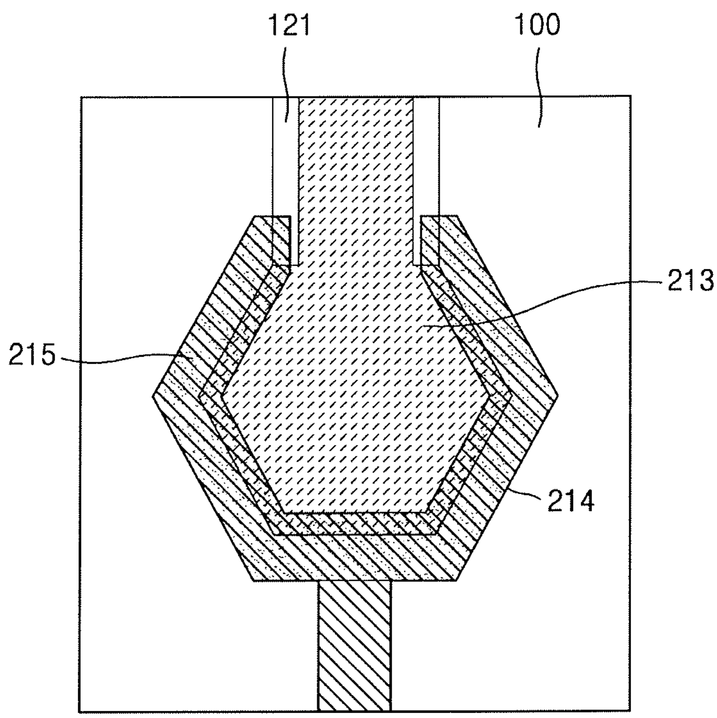
FIG. 3D is a planar view illustrating a process of manufacturing a thin film transistor, according to an exemplary embodiment of the present inventive concept.

The semiconductor layer 214 may be formed on the second electrode 215 as illustrated in FIG. 3D. The semiconductor layer 214 may include an oxide semiconductor. For example, the semiconductor layer 214 may include oxides including metal elements from Groups 12, 13, and 14 of the periodic table of elements, such as Zn, In, Ga, Sn, Cd, Ge, and Hf, or materials selected from a combination of the metal elements. According to an exemplary embodiment of the present inventive concept, the semiconductor layer 214 may include Zn oxide materials such as Zn oxides, In—Zn oxides, and Ga—In—Zn oxides. For example, the semiconductor layer 214 may include ZnO, ZTO, ZIO, InO, TiO, IGZO, and IZTO. However, materials of the semiconductor layer 214 are not limited thereto. For example, the semiconductor layer 214 may include amorphous silicon, polycrystalline silicon, or organic semiconductor materials. Further, the semiconductor layer 214 may be formed by various deposition methods such as sputtering and vapor deposition, and be patterned thereafter.

Figure 3E:
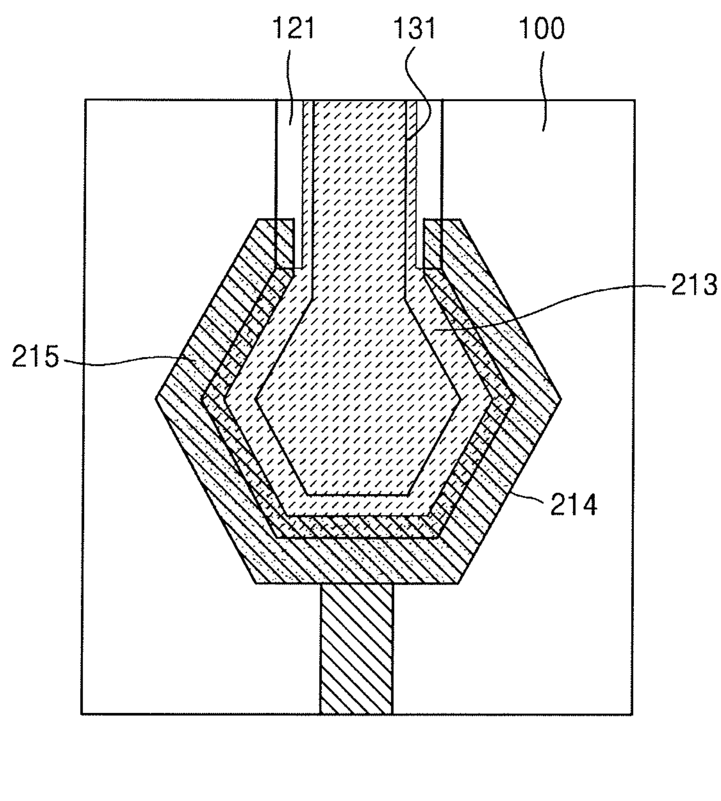
FIG. 3E is a planar view illustrating a process of manufacturing a thin film transistor, according to an exemplary embodiment of the present inventive concept.

The gate insulating layer 131 may be formed as illustrated in FIG. 3E. For example, the peripheral insulating part 131*b* of the gate insulating layer 131 may be formed on the semiconductor layer 214, and the central insulating part of the gate insulating part 131 may be formed on the first electrode 213. The gate insulating layer 131 may include $SiO_2$, $SiN_x$, SiON, $Al_2O_3$, $TiO_2$, $Ta_2O_5$, $HfO_2$, $ZnO_2$, or aluminum oxides. The gate insulating layer 131 may be formed by various deposition methods, such as sputtering, CVD, and PECVD, and the gate insulating layer 131 may be patterned thereafter.

Figure 3F:
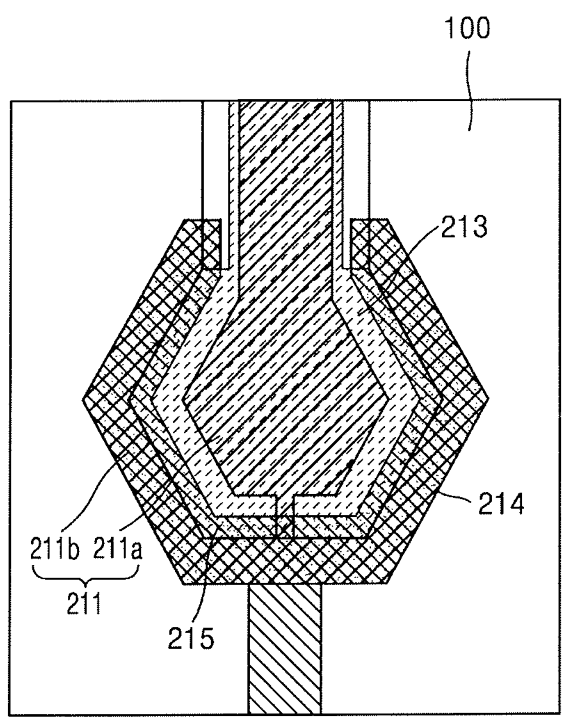
FIG. 3F is a planar view illustrating a process of manufacturing a thin film transistor according to an exemplary embodiment of the present inventive concept.

The gate electrode 211 may be formed on the gate insulating layer 131, as illustrated in FIG. 3F. The gate electrode 211 may be formed by various deposition methods such as sputtering, CVD, and PECVD, and the gate electrode 211 may be patterned thereafter. The gate electrode 211 may be patterned into the center part 211*a* overlapping the first electrode 213. In addition, the gate electrode 211 may be patterned into the peripheral part 211*b* partially overlapping the second electrode 215.

The gate insulating layer 131 and the gate electrode 211 are illustrated as being sequentially patterned in FIGS. 3E and 3F. However, exemplary embodiments of the present inventive concept are not limited thereto. For example, an insulating layer forming the gate insulating layer 131 and a metal layer forming the gate electrode 211 may be sequentially disposed, and the gate insulating layer 131 and the gate electrode 211 may be simultaneously patterned.

Figure 4A:
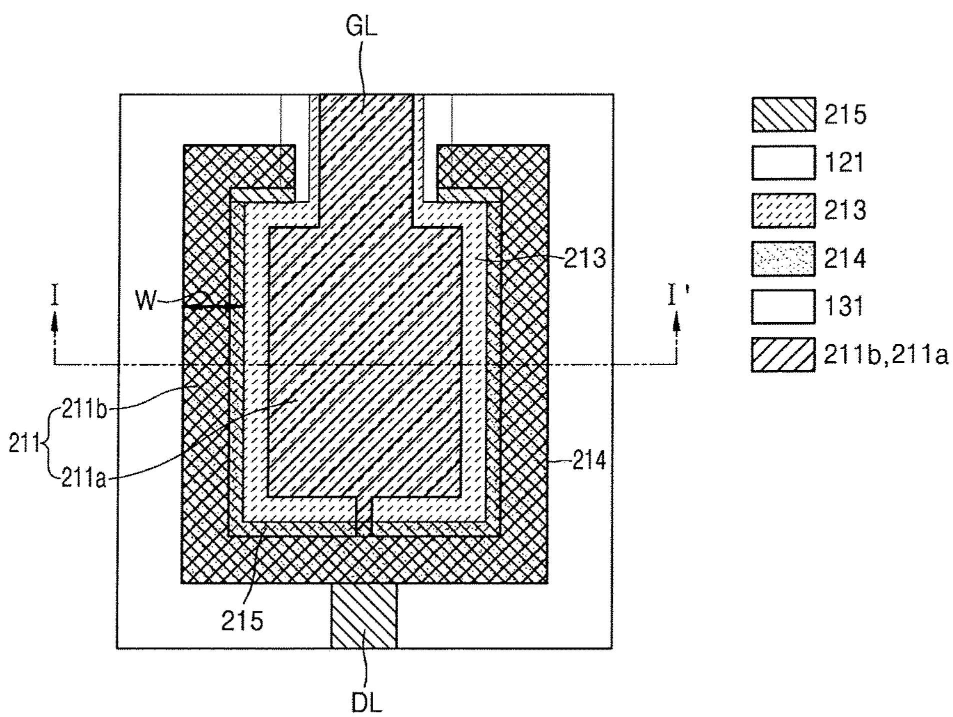
FIG. 4A is a planar view of a thin film transistor according to an exemplary embodiment of the present inventive concept.
Figure 4B:
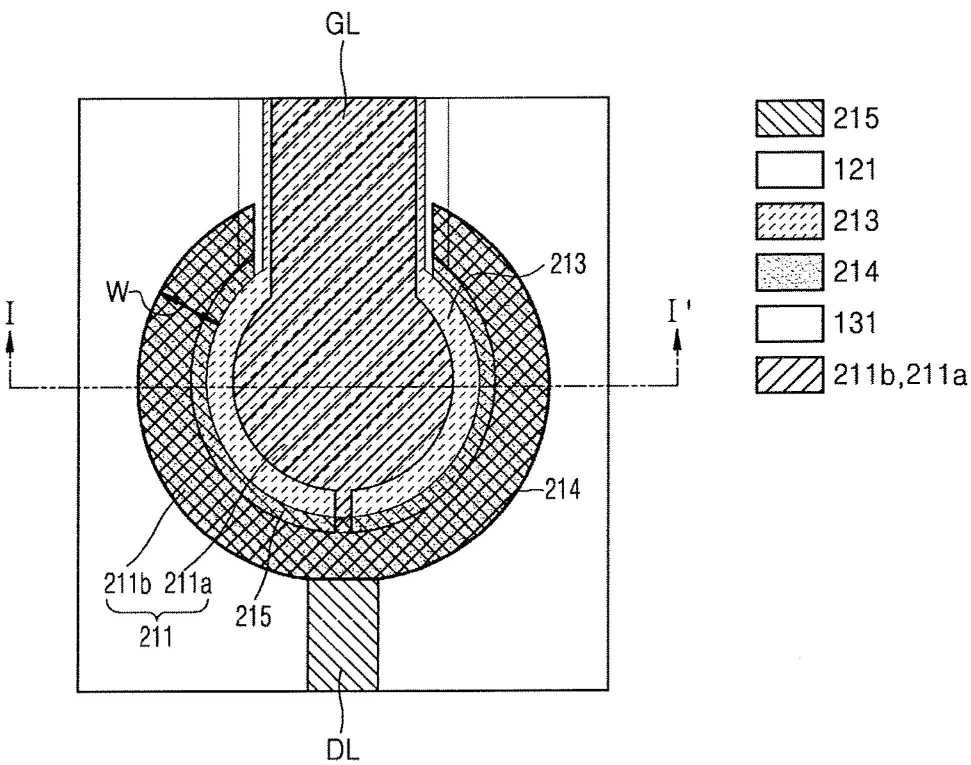
FIG. 4B is a planar view of a thin film transistor according to an exemplary embodiment of the present inventive concept.
Figure 4C:
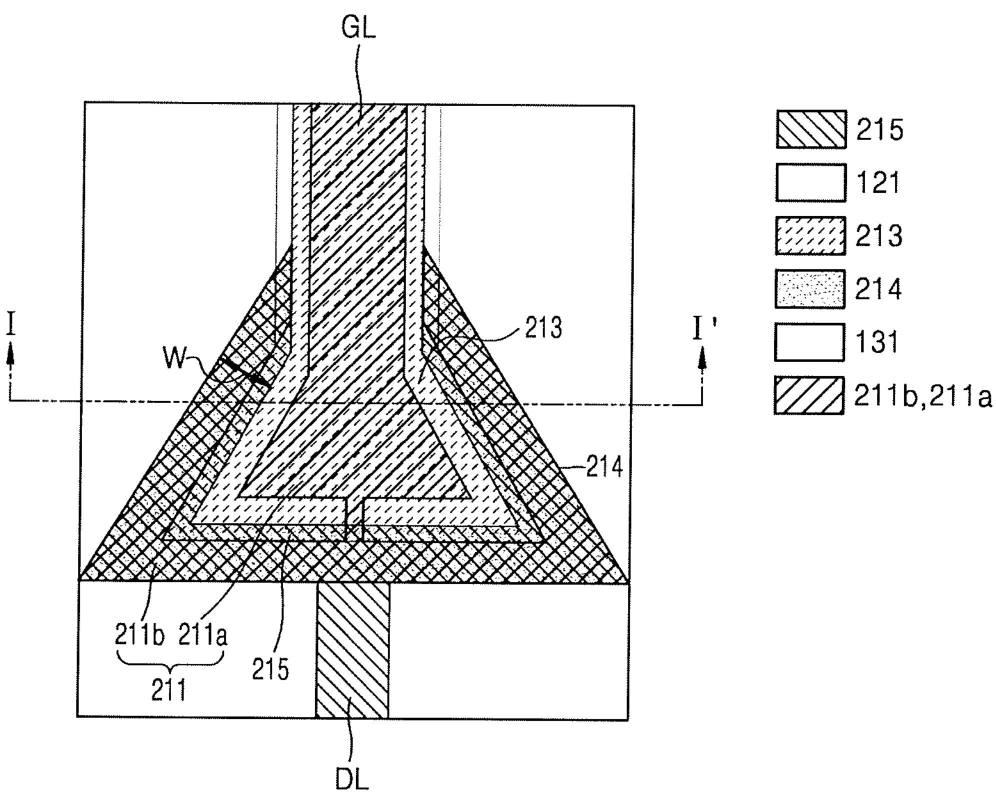
FIG. 4C is a planar view of a thin film transistor according to an exemplary embodiment of the present inventive concept.

FIGS. 4A through 4C are planar views of a TFT according to an exemplary embodiment of the present inventive concept. Since the TFTs in FIGS. 4A through 4C are substantially the same as the TFT in FIG. 2A, repeated descriptions thereof will be omitted. Referring to FIGS. 4A through 4C, the center part 211*a* of the gate electrode 211 may have a rectangular shape (e.g., as shown in FIG. 4A), a circular shape (e.g., as shown in FIG. 4B), a triangular shape (e.g., as shown in 4C), etc. Accordingly, the shapes of the peripheral part 211*b* of the gate electrode 211, the first electrode 213, the second electrode 215, the semiconductor layer 214, the spacer 121, and the gate insulating layer 131 may be changed, depending on the shape of the center part 211*a*. The shapes may be determined by considering the capacitance of the overlap capacitor C0, which includes the center part 211*a* of the gate electrode 211 and the first electrode 213, and the devices and wirings arranged around the TFT.

Figure 5:
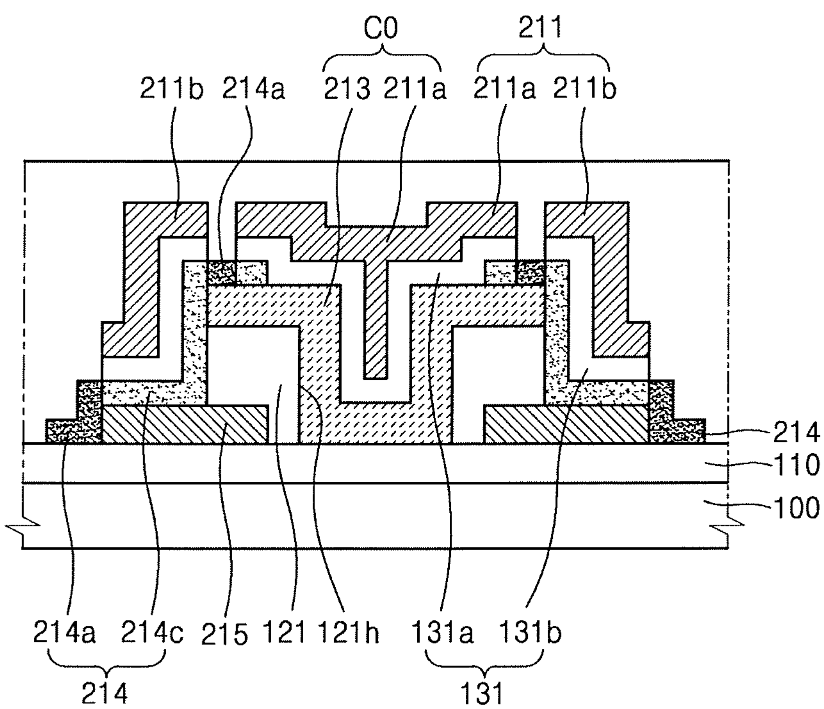
FIG. 5 is a cross-sectional view of a thin film transistor according to an exemplary embodiment of the present inventive concept.

FIG. 5 is a cross-sectional view of a TFT according to an exemplary embodiment of the present inventive concept.

Referring to FIG. 5, a portion of the spacer 121, which overlaps the center part 211*a* of the gate electrode 211, may be removed in FIG. 5. A hole 121*h* is provided in a central area of the spacer 121. However, in an exemplary embodiment of the present inventive concept, the spacer 121 may include a groove with a bottom surface thereof unexposed. There may be a plurality of holes 121*h* or grooves, and the hole 121*h* or groove may have various shapes.

Since the first electrode 213 is filled according to the shape of the hole 121*h* or the groove of the spacer 121, a total area of the first electrode 213 may be increased. In addition, a total area of the center part 211*a* of the gate electrode 211, which overlaps the first electrode 213, may be increased. This effect may denote that the capacitance of the overlap capacitor C0 formed by the first electrode 213 and the center part 211*a* may be increased. Accordingly, the TFT may adjust the capacitance of the overlap capacitor C0 within a certain range based on adjustments to the total area of the first electrode 213 and the total area of the gate electrode 211. Thus, this may be useful for high-density integration.

Figure 6:
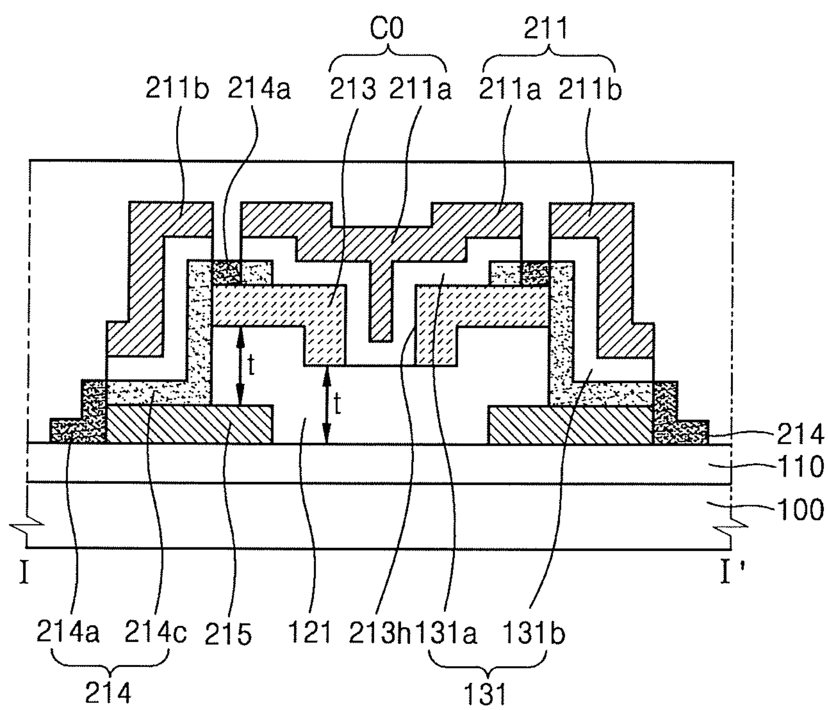
FIG. 6 is a cross-sectional view of a thin film transistor according to an exemplary embodiment of the present inventive concept.

FIG. 6 is a cross-sectional view of a TFT according to an exemplary embodiment of the present inventive concept.

Referring to FIG. 6, a portion of the first electrode 213, which overlaps the center part 211*a* of the gate electrode 211, may be removed. A hole 213*h* may be provided in a central area of the first electrode 213. There may be a plurality of holes 213*h*, and the hole 213*h* may have various shapes.

The total area of the first electrode 213 may be decreased by the spacer 121 including the hole 213*h*. This effect may denote that the capacitance of the overlap capacitor C0 formed by the first electrode 213 and the center part 211*a* may be decreased. Accordingly, the TFT may adjust the capacitance of the overlap capacitor C0 within a certain range based on adjustments to the total area of the first electrode 213. Thus, this may be useful for high-density integration.

Figure 7:
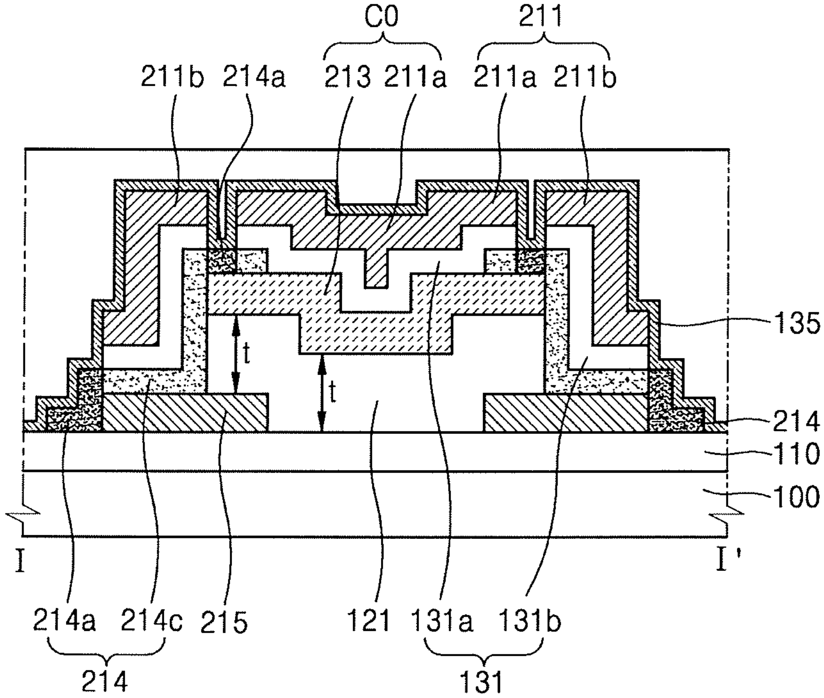
FIG. 7 is a cross-sectional view of a thin film transistor according to an exemplary embodiment of the present inventive concept.

FIG. 7 is a cross-sectional view of a TFT according to an exemplary embodiment of the present inventive concept. Further, repeated descriptions are omitted for the purpose of convenience.

Referring to FIG. 7, the TFT according to an exemplary embodiment of the present inventive concept may further include a protection layer 135 which may be a wholly connected structure on the entire surface of the substrate 100 and may cover the gate electrode 211 of the TFT.

The protection layer 135 may block the infiltration of hydrogen, moisture, other external contaminants, etc. by covering the gate electrode 211 and the source-drain area 214*a* of the semiconductor layer 214, which is not covered by the gate electrode 211. The protection layer 135 may include either organic or inorganic insulating materials. According to an exemplary embodiment of the present inventive concept, the protection layer 135 may include inorganic materials, such as silicon oxide, silicon nitride, metal oxide, etc.

According to an exemplary embodiment of the present inventive concept, the protection layer 135 may include aluminum oxides (AlOx). For example, the protection layer 135 may be formed by depositing an aluminum layer with a thickness of about 2 μm to about 4 μm and annealing the aluminum layer. The carrier density of the source-drain area 214*a* of the semiconductor layer 214 may be increased by using oxygen in the semiconductor layer 214 as reacting oxygen. For example, the protection layer 135 may protect the TFT and increase performance of the TFT. However, a forming method of the protection layer 135 is not limited thereto. For example, the protection layer 135 may be formed by various deposition methods, such as sputtering, ALD, CVD, and PECVD.

Figure 8:
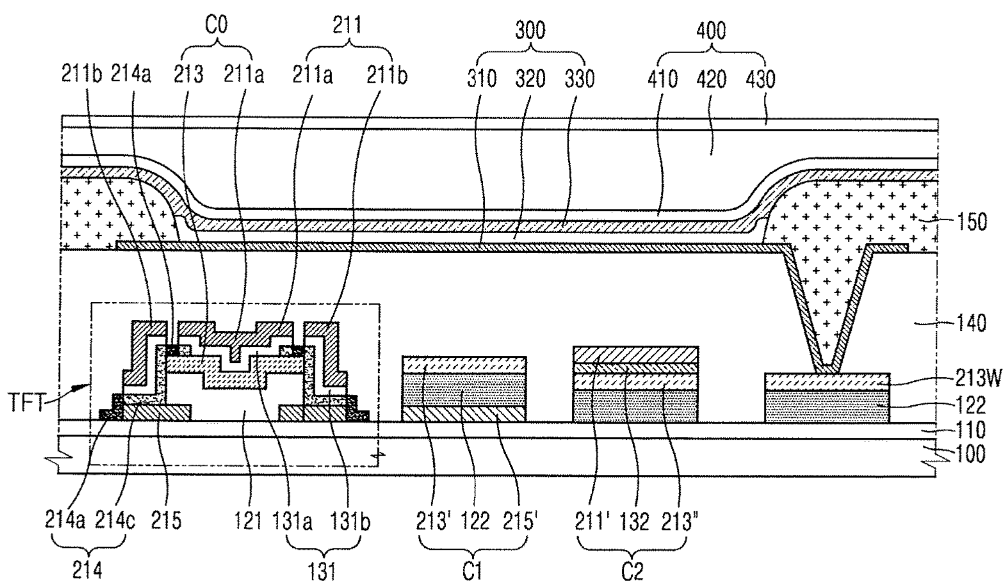
FIG. 8 is a cross-sectional view of a portion of a display apparatus including a thin film transistor according to an exemplary embodiment of the present inventive concept.
Figure 9:
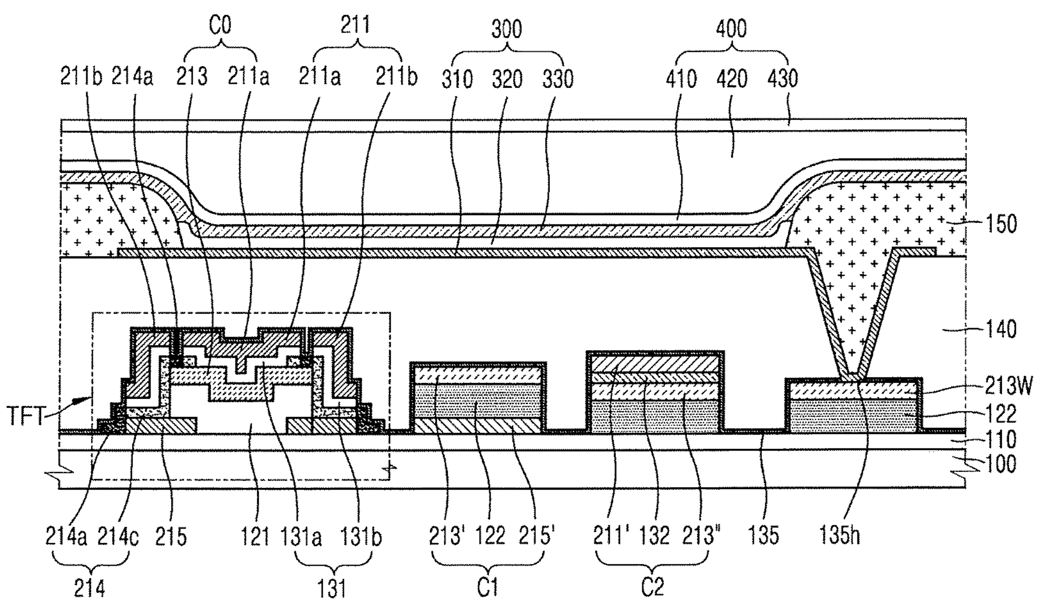
FIG. 9 is a cross-sectional view of a portion of a display apparatus according to an exemplary embodiment of the present inventive concept.

FIGS. 8 and 9 are cross-sectional views of portions of a display apparatus including a TFT according to exemplary embodiments of the present inventive concept.

The display apparatus is an apparatus that displays image, and types of display apparatuses may include a liquid crystal display, an electrophoretic display, an organic light-emitting display, an inorganic light-emitting display, a field emission display, a surface-conduction electron-emitter display, a plasma display, a cathode ray display, etc.

Below, the display apparatus according to an exemplary embodiment of the present inventive concept will be described as an organic light-emitting display as an example. However, exemplary embodiments of the present inventive concept are not limited thereto. Displays with various methods of displaying an image may be used. For example, the display apparatus may include an inorganic light-emitting display.

Referring to FIG. 8, the display apparatus may include a first capacitor C1 and/or a second capacitor C2, a display device 300, and an encapsulation layer 400 in addition to the TFT described above. In addition, the display apparatus may include signal lines such as a gate line transferring a gate signal, a data line transferring a data signal, a driving power line transferring a power supply, and a common power supply line. Then, pixels may be formed by an electrical combination of the gate line, the driving power supply line, the TFT connected to the driving power supply line, the capacitors C0, C1, and C2, the display device 300, etc. As a result of the electrical combination, the display apparatus may display images. The pixels may emit light at an intensity corresponding to driving current passing through the display device 300, in response to the data signal according to the driving power supply and the common power supply supplied to the pixels. The pixels may be formed in a plurality, and the plurality of pixels may be arranged in various manners such as a stripe matrix or a PenTile matrix.

FIG. 8 illustrates that the display device 300 may include an organic light-emitting device. The organic light-emitting device electrically connected to the TFT may denote that a pixel electrode 310 is electrically connected to the TFT.

The first capacitor C1 may include a third electrode 213', a fourth electrode 215', and a first insulating layer 122 disposed between the third electrode 213' and the fourth electrode 215'. The third electrode 213' may include substantially the same material as the first electrode 213 of the TFT and may simultaneously include the first electrode 213. The fourth electrode 215' may include substantially the same material as the second electrode 215 of the TFT and may simultaneously include the second electrode 215. The first insulating layer 122 may include substantially the same material as the spacer 121 of the TFT and may simultaneously include the spacer 121.

The second capacitor C2 may include a fifth electrode 213", a sixth electrode 211', and a second insulating layer 132 disposed between the fifth electrode 213" and the sixth electrode 211'. The fifth electrode 213" may include substantially the same material as the first electrode 213 of the TFT and may simultaneously include the first electrode 213. The sixth electrode 211" may include substantially the same material as the gate electrode 211 of the TFT and may simultaneously include the gate electrode 211. The second insulating layer 132 may include substantially the same material as the gate insulating layer 131 of the TFT and may simultaneously include the gate insulating layer 131. The second capacitor C2 may further include the first insulating layer 122 on a bottom thereof. For example, the first insulating layer 122 may be disposed below the fifth electrode 213".

According to an exemplary embodiment of the present inventive concept, since the TFT includes the overlap capacitor C0, the first and second capacitors C1 and C2 may be omitted. In addition, if an additional capacitor is used, any one of the first and second capacitors C1 and C2 may be used. Further, both of the first and second capacitors C1 and C2 may be used depending on the case.

A planarization layer 140 may be disposed on the TFT and/or the first and second capacitors C1 and C2 such that the TFT and/or the first and second capacitors C1 and C2 are covered. For example, if the organic light-emitting device is disposed on the TFT as illustrated in FIG. 8, the planarization layer 140 may planarize an upper surface of the protection layer 135 covering the TFT. The planarization layer 140 may include organic materials such as acryl, benzocyclobutene (BCB) and hexamethyldisiloxane (HMDSO). The planarization layer 140 is illustrated as a single layer in FIG. 8. However, the planarization layer 140 may have various shapes such as multiple layers.

The pixel electrode 310, a counter electrode 330, and the organic light-emitting device including an intermediate layer 320, which is disposed between the pixel electrode 310 and the counter electrode 330 and includes a light-emitting layer, may be disposed on the planarization layer 140. For example, the intermediate layer 320 may be disposed on the portion of the pixel electrode exposed. As illustrated in FIG. 8, the pixel electrode 310 may contact either the first electrode 213 or the second electrode 215 through openings formed in the planarization layer 140, etc., and may be electrically connected to the TFT. In FIG. 8, the pixel electrode 310 is illustrated as being connected to a connecting wire 213W which is electrically connected to the first electrode 213.

The pixel electrode 310 may include a transparent electrode or a reflective electrode. The transparent electrode may include ITO, IZO, ZnO, or $In_2O_3$. The reflective electrode may include a reflective layer formed of Ag, Mg, Al, Pt, Pd, Au, Ni, Nd, Ir, Cr, or a combination of these metals, and a transparent layer formed of ITO, IZO, ZnO, or $In_2O_3$. According to an exemplary embodiment of the present inventive concept, the pixel electrode 310 may include a structure of ITO/Ag/ITO.

A pixel defining layer 150 may be disposed on the planarization layer 140. The pixel defining layer 150 may define a pixel by including an opening corresponding to respective sub-pixels by including the opening which exposes at least a central area of the pixel electrode 310. For example, part of the pixel electrode 310 may be covered by the pixel defining layer 150. In addition, as illustrated in FIG. 8, the pixel defining layer 150 may prevent arcing at edges of the pixel electrode 310 by increasing a distance between the edges of the pixel electrode 310 and the edges of the counter electrode 330 disposed above the pixel electrode 310. The pixel defining layer 150 may include organic materials such as polyimide and HMDSO.

The intermediate layer 320 of the organic light-emitting device may include either low molecular weight materials or polymer materials. If the intermediate layer 320 includes low molecular weight materials, a hole injection layer (HIL), a hole transport layer (HTL), an emission layer (EML), an electron transport layer (ETL), an electron injection layer (EIL), etc. may have laminated structures including a single layer or multiple layers, and include various organic materials such as copper phthalocyanine (CuPc), N,N'-di(1-naphthyl)-N,N'-diphenylbenzidine (NPB), and tris(8-hydroxyquinoline) aluminum (Alq3). The layers described above may be formed by, for example, a vacuum deposition method.

If the intermediate layer 320 includes polymer materials, the intermediate layer 320 may have a structure which generally includes an HTL and an EML. In this case, the HTL may include poly 3,4-ethylenedioxythiophene (PEDOT). In addition, the light-emitting layer may include polymer materials, such as poly-phenylenevinylene (PPV) and polyfluorene. The intermediate layer 320 may be formed by, for example, screen printing, inkjet printing, laser induced thermal imaging (LITI), etc.

However, the intermediate layer 320 is not limited thereto. For example, the intermediate layer 320 may include various structures. In addition, the intermediate layer 320 may include an integrated layer covering a plurality of pixel electrodes 310 and a patterned layer to correspond to each of the plurality of pixel electrodes 310.

The counter electrode 330 may be disposed on the pixel electrode 310 with the intermediate layer 320 interposed therebetween. The counter electrode 330 may be formed as a wholly connected body with respect to a plurality of organic light-emitting devices and may correspond to the plurality of the pixel electrodes 310. For example, the pixel electrode 310 may be patterned at each sub-pixel, and the counter electrode 330 may apply a common voltage to all pixels. The counter electrode 330 may include either a transparent electrode or a reflective electrode.

Holes and electrons injected from the pixel electrode 310 and the counter electrode 330 of the organic light-emitting device may combine with one another in the light-emitting layer of the intermediate layer 320. Accordingly, excitons will be generated, and as the excitons relaxes, light will be emitted.

Because an organic light-emitting device is easily damaged by moisture, oxygen, other contaminants, etc. from the outside, the encapsulation layer 400 may protect the organic light-emitting device by covering the organic light-emitting device. The encapsulation layer 400 may include at least one organic encapsulation layer and at least one inorganic encapsulation layer. For example, the encapsulation layer 400 may include a first inorganic encapsulation layer 410, an organic encapsulation layer 420, and a second inorganic encapsulation layer 430, as illustrated in FIG. 8.

The first inorganic encapsulation layer 410 may be disposed on the counter electrode such that the counter electrode 330 may be covered. In addition, the first inorganic encapsulation layer 410 may include silicon oxide, silicon nitride, and/or silicon oxynitride, etc. In addition, other layers such as a capping layer may be disposed between the first inorganic encapsulation layer 410 and the counter electrode 330, when needed. Since the first inorganic encapsulation layer 410 corresponds to a structure thereunder, an upper surface thereof may not be flat. The organic encapsulation layer 420 may be disposed on the first inorganic encapsulation layer 410 such that the first inorganic encapsulation layer 410 may be covered. In addition, unlike the first inorganic encapsulation layer 410, an upper surface thereof may be generally flat. The organic encapsulation layer 420 may include PET, PEN, PC, PI, PES, polyoxymethylene (POM), polyallylate, and/or polydimethylsiloxane. The second inorganic encapsulation layer 430 may be disposed on the organic encapsulation layer 420 such that the organic encapsulation layer 420 may be covered. In addition, the second inorganic encapsulation layer 430 may include silicon oxide, silicon nitride, and/or silicon oxynitride, etc.

Since the encapsulation layer 400 includes the first inorganic encapsulation layer 410, the organic encapsulation layer 420 and the second inorganic encapsulation layer 430, a crack might not extend between the first inorganic encapsulation layer 410 and the organic encapsulation layer 420 or between the organic encapsulation layer 420 and the second inorganic encapsulation layer 430, due to such a multilayer structure, even when the crack occurs in the encapsulation layer 400. A formation of an infiltration route of humidity, oxygen, other contaminants, etc. from the outside through the crack to the display device 300 may be prevented or reduced.

Since the display apparatus of this disclosure includes the TFT described above, the TFT that has a reduced size regardless of the channel length of the TFT may be included in the display apparatus. In addition, since the TFT includes the overlap capacitor C0, high resolution and high integration may be achieved. In addition, bending characteristics of the display apparatus may be enhanced by using the TFT including the vertical channel.

Referring to FIG. 9, the display apparatus according to an exemplary embodiment of the present inventive concept may cover the TFT and/or the first and second capacitors C1 and C2, and may further include the protection layer 135 which is formed as a wholly connected body on the entire surface of the substrate 100. For example, the protection layer 135 may overlap the entire surface of the substrate 100. The protection layer 135 may include an opening 135*h* at an area where the pixel electrode 310 is connected to the TFT. In FIG. 9, the pixel electrode 310 may be electrically connected to the connecting wire 213W, which may be electrically connected to the first electrode 213 of the TFT. For example, the pixel electrode 310 is illustrated as filling the opening 135*h* of the protection layer 135 and being electrically connected to the connecting wire 213W.

The protection layer 135 may block an infiltration of oxygen, moisture, other external contaminants, etc. by covering the gate electrode 211, the source-drain area 214*a* of the semiconductor layer 214, which is not covered by the gate electrode 211, and the first and second capacitors C1 and C2. The protection layer 135 may include either organic or inorganic insulating materials. According to an exemplary embodiment of the present inventive concept, the protection layer 135 may include inorganic materials such as silicon oxide, silicon nitride, and metal oxide.

According to an exemplary embodiment of the present inventive concept, the protection layer 135 may include AlOx. For example, the protection layer 135 may be formed by depositing an aluminum layer with a thickness of about 2 μm to about 4 μm and annealing the aluminum layer. The carrier density of the source-drain area 214*a* of the semiconductor layer 214 may be increased by using oxygen in the semiconductor layer 214 as the reacting oxygen. For example, the protection layer 135 may not only protect the TFT but also improve the performance of the TFT. However, a forming method of the protection layer 135 is not limited thereto. The protection layer 135 may be formed by various deposition methods such as sputtering, ALD, CVD, and PECVD.

As described above, the TFT according to an exemplary embodiment of the present inventive concept may be applied to an organic light-emitting display apparatus. However, exemplary embodiments of the present inventive concept are not limited thereto, and the TFT may be applied to various display apparatuses such as a plasma display apparatus and an electrophoretic display apparatus.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the appended claims.

What is claimed is:

1. A thin film transistor comprising:

a substrate;

a gate electrode disposed over the substrate, and comprising a center part and a peripheral part configured to at least partially surround the center part, wherein the gate electrode includes an opening disposed directly between the center part and the peripheral part, and the opening at least partially surrounds the center part of the gate electrode;

a gate insulating layer disposed below the gate electrode;

a first electrode insulated from the gate electrode by the gate insulating layer, and having at least a portion thereof overlapping the center part in a direction perpendicular to an upper surface of the substrate;

a spacer disposed below the first electrode;

a second electrode insulated from the first electrode by the spacer, and having at least a portion thereof overlapping the peripheral part; and a semiconductor layer connected to the first and second electrodes, and insulated from the gate electrode by the gate insulating layer.

2. The thin film transistor of claim 1, wherein the peripheral part is connected to one side of the center part, is uniformly separated from the center part according to a shape of the center part, and is configured to at least partially surround the perimeter of the center part.

3. The thin film transistor of claim 2, wherein the center part has a circular shape, an elliptical shape, or a polygonal shape.

4. The thin film transistor of claim 2, wherein the peripheral part is configured to surround the perimeter of the center part.

5. The thin film transistor of claim 1, wherein the center part and the first electrode, and the gate insulating layer, which is disposed between the center part and the first electrode, form a capacitor.

6. The thin film transistor of claim 1, wherein the semiconductor layer is configured to cover a portion of the first electrode and at least a portion of the second electrode, and to connect the first electrode and the second electrode to one another in the direction perpendicular to the upper surface of the substrate.

7. The thin film transistor of claim 1, wherein the first electrode overlaps at least a portion of the second electrode.

8. The thin film transistor of claim 1, wherein the spacer includes a hole.

9. The thin film transistor of claim 1, wherein the first electrode includes a hole.

10. The thin film transistor of claim 1, wherein the gate electrode and the gate insulating layer have a same planar shape.

11. The thin film transistor of claim 1, further comprising a protection layer configured to cover the gate electrode, wherein the protection layer is a wholly connected body spanning the entire surface of the substrate.

12. The thin film transistor of claim 1, wherein the semiconductor layer comprises an oxide semiconductor.

13. A display apparatus comprising:

a thin film transistor which comprises:

a substrate;

a gate electrode including a center part and a peripheral part configured to at least partially surround the center part, wherein the gate electrode includes an opening disposed directly between the center part and the peripheral part, and the opening at least partially surrounds the center part of the gate electrode;

a gate insulating layer disposed below the gate electrode;

a first electrode which is insulated from the gate electrode by the gate insulating layer, and has at least a portion thereof overlapping the center part in a direction perpendicular to an upper surface of the substrate;

a spacer disposed below the first electrode;

a second electrode which is insulated from the first electrode by the spacer, and has at least a portion thereof overlapping the peripheral part; and a semiconductor layer which is connected to the first electrode and the second electrode, and is insulated from the gate electrode by the gate insulating layer;

a planarization layer configured to cover the thin film transistor;

a pixel electrode which is disposed over the planarization layer and is electrically connected to the first electrode or the second electrode;

a counter electrode disposed over the pixel electrode; and an intermediate layer disposed between the pixel electrode and the counter electrode.

14. The display apparatus of claim 13, further comprising:

a first capacitor including a third electrode including a same material as the first electrode;

a fourth electrode including a same material as the second electrode; and a first insulating layer disposed between the third electrode and the fourth electrode, and including a same material as the spacer.

15. The display apparatus of claim 13, further comprising:

a second capacitor including a fifth electrode including a same material as the first electrode;

a sixth electrode including a same material as the gate electrode; and a second insulating layer disposed between the fifth electrode and the sixth electrode, and including a same material as the gate insulating layer.

16. The display apparatus of claim 13, further comprising a pixel defining layer configured to expose a center area of the pixel electrode, and to cover a peripheral area thereof.

17. The display apparatus of claim 13, wherein the intermediate layer comprises an organic light-emitting layer.

18. The display apparatus of claim 13, wherein the peripheral part is connected to one side of the center part, is uniformly separated from the center part according to a shape of the center part, and is configured to at least partially surround the periphery of the center part.

19. The display apparatus of claim 13, wherein the center part, the first electrode, and the gate insulating layer, which is disposed between the center part and the first electrode, form a capacitor.

20. The display apparatus of claim 13, wherein the semiconductor layer is configured to cover a portion of the first electrode and at least a portion of the second electrode, and to connect the first electrode and the second electrode in the direction perpendicular to the upper surface of the substrate.

21. A thin film transistor comprising:

a substrate;

a bottom electrode disposed on the substrate;

an upper electrode disposed above and partially overlapping the bottom electrode, and including a first edge portion, a second edge portion opposite the first edge portion, and a central portion disposed between the first edge portion and the second edge portion;

a spacer disposed between the bottom electrode and the upper electrode;

a semiconductor layer covering portions of the bottom electrode and portions of the upper electrode, and extending vertically to connect the bottom electrode and the upper electrode, wherein the semiconductor layer includes a first portion overlapping the first edge portion, a second portion overlapping the second edge portion, and an opening directly between the first portion and the second portion, the opening overlapping the central portion of the upper electrode; and a gate electrode disposed above an upper surface of the upper electrode, wherein the gate electrode is insulated from the upper electrode and the semiconductor layer by a gate insulating layer.

22. The thin film transistor of claim 21, wherein the gate electrode, the upper electrode, and the gate insulating layer form a capacitor.

23. The thin film transistor of claim 21, wherein adjusting a thickness of the spacer, vertically adjusts a length of the semiconductor layer.

24. The thin film transistor of claim 1, wherein the first electrode is disposed on a layer different from that of the gate electrode.

25. The thin film transistor of claim 1, wherein the center part is disposed on an upper surface of the gate insulating layer, and the gate insulating layer is disposed on an upper surface of the first electrode.

* * * * *